US012226996B2

(12) United States Patent
Liu et al.

(10) Patent No.: US 12,226,996 B2
(45) Date of Patent: Feb. 18, 2025

(54) LAMINATED GRAPHENE BASED THERMALLY CONDUCTIVE FILM AND METHOD FOR MANUFACTURING THE FILM

(71) Applicant: SHT Smart High-Tech AB, Gothenburg (SE)

(72) Inventors: Johan Liu, Västra Frölunda (SE); Nan Wang, Mölndal (SE)

(73) Assignee: SHT Smart High-Tech AB, Gothenburg (SE)

( * ) Notice: Subject to any disclaimer, the term of this patent is extended or adjusted under 35 U.S.C. 154(b) by 1054 days.

(21) Appl. No.: 17/106,650

(22) Filed: Nov. 30, 2020

(65) Prior Publication Data
US 2021/0078288 A1   Mar. 18, 2021

Related U.S. Application Data

(63) Continuation of application No. PCT/SE2018/050593, filed on Jun. 7, 2018.

(51) Int. Cl.
*B32B 9/00*   (2006.01)
*B32B 5/16*   (2006.01)
(Continued)

(52) U.S. Cl.
CPC ............... *B32B 9/007* (2013.01); *B32B 5/16* (2013.01); *B32B 7/027* (2019.01); *B32B 7/12* (2013.01);
(Continued)

(58) Field of Classification Search
None
See application file for complete search history.

(56) References Cited

U.S. PATENT DOCUMENTS 4,331,495 A   5/1982   Lackman et al.
5,180,459 A   1/1993   Bauer et al.
(Continued)

FOREIGN PATENT DOCUMENTS

CN   101048055 A   10/2007
CN   105722375 A   3/2018
(Continued)

OTHER PUBLICATIONS

JP2012136022A_machine_translation (Year: 2012).*
(Continued)

*Primary Examiner* — Michael N Orlando
*Assistant Examiner* — Abhishek A Patwardhan
(74) *Attorney, Agent, or Firm* — RMCK Law Group, PLC

(57) ABSTRACT

Method of manufacturing a vertically aligned laminated graphene based thermally conductive film. The method comprising: attaching first and second graphene film using a layer of nanoparticles and an adhesive; forming a layered film comprising a predetermined number of graphene film layers by repeating the steps of arranging a layer of nanoparticles, arranging an adhesive and attaching a graphene film; and laminating the layered film by applying pressure and heat to cure the adhesive, thereby forming a laminate film; cutting the laminate film at an angle in relation to a surface plane of the film to form the vertically aligned laminated graphene based thermally conductive film.

13 Claims, 6 Drawing Sheets

(51) Int. Cl.
| | |
|---|---|
| *B32B 7/027* | (2019.01) |
| *B32B 7/12* | (2006.01) |
| *B32B 9/04* | (2006.01) |
| *B32B 37/12* | (2006.01) |
| *B32B 37/24* | (2006.01) |
| *B32B 38/00* | (2006.01) |
| *B32B 38/10* | (2006.01) |
| *B82Y 30/00* | (2011.01) |
| *B82Y 40/00* | (2011.01) |
| *C01B 32/194* | (2017.01) |
| *F28F 3/02* | (2006.01) |
| *F28F 21/02* | (2006.01) |
| *H05K 7/20* | (2006.01) |

(52) U.S. Cl.
CPC .............. *B32B 9/04* (2013.01); *C01B 32/194* (2017.08); *F28F 3/02* (2013.01); *F28F 21/02* (2013.01); *H05K 7/2039* (2013.01); *B32B 2037/1253* (2013.01); *B32B 37/24* (2013.01); *B32B 38/004* (2013.01); *B32B 38/10* (2013.01); *B32B 2255/205* (2013.01); *B32B 2255/26* (2013.01); *B32B 2264/108* (2013.01); *B32B 2307/302* (2013.01); *B32B 2313/04* (2013.01); *B32B 2319/00* (2013.01); *B32B 2333/00* (2013.01); *B32B 2363/00* (2013.01); *B32B 2375/00* (2013.01); *B32B 2379/08* (2013.01); *B32B 2457/00* (2013.01); *B82Y 30/00* (2013.01); *B82Y 40/00* (2013.01); *Y10T 156/1062* (2015.01); *Y10T 156/108* (2015.01)

(56) References Cited

U.S. PATENT DOCUMENTS

| | | | | |
|---|---|---|---|---|
| 7,531,595 | B2 | 5/2009 | Lewandowski et al. | |
| 7,797,808 | B2 | 9/2010 | Zhang et al. | |
| 9,338,927 | B2* | 5/2016 | Mataya | H05K 7/20481 |
| 9,645,454 | B2 | 5/2017 | Naito et al. | |
| 9,746,259 | B2 | 8/2017 | Tanaka et al. | |
| 10,087,073 | B2 | 10/2018 | Lin et al. | |
| 11,235,557 | B2 | 2/2022 | Liu et al. | |
| 2004/0188081 | A1 | 9/2004 | Oh | |
| 2005/0111189 | A1 | 5/2005 | Smalc et al. | |
| 2006/0134362 | A1* | 6/2006 | Lu | C09J 7/385 |
| | | | | 428/40.1 |
| 2007/0053168 | A1* | 3/2007 | Sayir | H01L 23/367 |
| | | | | 257/E23.105 |
| 2007/0213449 | A1* | 9/2007 | Lewandowski | C09J 133/14 |
| | | | | 524/556 |
| 2008/0019097 | A1 | 1/2008 | Zhang et al. | |
| 2011/0114342 | A1 | 5/2011 | Ono et al. | |
| 2011/0303399 | A1 | 12/2011 | Sakimichi et al. | |
| 2012/0070612 | A1 | 3/2012 | Lee et al. | |
| 2012/0156424 | A1 | 6/2012 | Chen et al. | |
| 2012/0295416 | A1 | 11/2012 | Kimura et al. | |
| 2013/0295384 | A1 | 11/2013 | Ma et al. | |
| 2014/0190676 | A1 | 7/2014 | Zhamu et al. | |
| 2014/0219906 | A1 | 8/2014 | Kim et al. | |
| 2015/0096731 | A1 | 4/2015 | Koch et al. | |
| 2016/0381832 | A1* | 12/2016 | Hurbi | H01L 23/373 |
| | | | | 165/185 |
| 2018/0023904 | A1* | 1/2018 | Kato | B32B 27/38 |
| | | | | 165/80.2 |
| 2021/0078288 | A1 | 3/2021 | Liu et al. | |
| 2021/0148648 | A1 | 5/2021 | Liu et al. | |
| 2021/0362471 | A1 | 11/2021 | Zhamu et al. | |
| 2022/0072825 | A1 | 3/2022 | Liu et al. | |

FOREIGN PATENT DOCUMENTS

| | | | | | |
|---|---|---|---|---|---|
| CN | 106113731 | A | | 3/2019 | |
| CN | 107209387 | A | | 5/2020 | |
| EP | 3258489 | A1 | | 12/2017 | |
| JP | 2009526113 | A | | 7/2009 | |
| JP | 2009529089 | A | | 8/2009 | |
| JP | 2009295921 | A | | 12/2009 | |
| JP | 2010114421 | A | | 5/2010 | |
| JP | 2012136022 | A | * | 7/2012 | ............ F21V 15/01 |
| JP | 2014022450 | A | | 2/2014 | |
| JP | 2014200926 | A | | 10/2014 | |
| KR | 20170095316 | A | | 8/2017 | |
| KR | 20170121543 | A | | 11/2017 | |
| WO | 2007090813 | A1 | | 8/2007 | |
| WO | 2016185688 | A1 | | 11/2016 | |
| WO | 2017013497 | A2 | | 1/2017 | |
| WO | 2018160106 | A1 | | 9/2018 | |
| WO | 2019194708 | A1 | | 10/2019 | |

OTHER PUBLICATIONS

Extended European Search Report dated Dec. 8, 2021 for European Patent Application No. 18921365.5, 6 pages.
English Translation of Chinese Office Action and Search Report dated Dec. 5, 2022 for Chinese Application No. 201980037278.7, 12 pages.
English translation of Second Chinese Office Action and Search Report dated Jun. 20, 2023 for CN Application No. 201880094256. X, 14 pages.
Partial English Translation of Chinese Office Action dated Dec. 9, 2023 for Chinese Application No. 201980037278.7, 14 pages.
Wei, Z. et al., "In-plane lattice thermal conductivities of multilayer graphene films," Carbon, vol. 49, 2011, pp. 2653-2658.
PCT International Search Report and Written Opinion for International Application No. PCT/SE2018/050593 mailed Feb. 18, 2019, 9 pages.
PCT International Search Report and Written Opinion for International Application No. PCT/SE2019/050080 mailed Apr. 10, 2019, 9 pages.
English Translation of Notice of Preliminary Rejection mailed Apr. 6, 2023 from the Korean Intellectual Property Office for Korean Application No. 10-2022-7030532, 14 pages.
U.S. Appl. No. 17/106,754, filed Nov. 30, 2020, Liu et al.
U.S. Appl. No. 17/524,871, filed Nov. 12, 2021, Liu et al.

* cited by examiner

LAMINATED GRAPHENE BASED THERMALLY CONDUCTIVE FILM AND METHOD FOR MANUFACTURING THE FILM

CROSS-REFERENCE TO RELATED APPLICATIONS

This application is a bypass continuation of International Patent Application No. PCT/SE2018/050593, filed on Jun. 7, 2018. The disclosure of the above application is incorporated herein by reference in its entirety.

FIELD OF THE INVENTION

The present invention relates to a laminated graphene based thermally conductive film and to a method for manufacturing such a film. In particular, the present invention relates to a thermally conductive film comprising tilted layers of graphene film.

BACKGROUND OF THE INVENTION

With the continuous development of modern electronics devices and systems, their increasing power densities have caused higher operating temperature. Therefore, effective thermal management is becoming extremely crucial to remove the large amount of heat required for ensuring high performance and long lifetime reliability. Thermal conductivity of traditional thermal interface materials (TIMs), a very important element for heat dissipation, is often less than max 10 W/mK, usually around 4 or 5 W/mK in vertical directions. Great efforts have hence been made to develop high performance TIMs based on carbon materials (e.g., graphite nano-platelets, carbon nanotubes and carbon fibers) in order to solve this problem.

A considerable number of studies have been devoted to increasing their thermal conductivity by increasing the graphene loading in graphene based thermally conductive adhesives. However, it is not practical for the fabrication process when the graphene content is too high.

Graphene, a surprising allotrope of carbon which is comprised of only one layer of atoms arranged in a two-dimensional hexagonal lattice, exhibits a number of unique properties, such as ultrafast electron mobility, super high mechanical strength, and unusually superior thermal performance (in-plane thermal conductivity=5000 W/mK). Besides, it is necessary to arrange graphene into particular structures so as to fulfill diverse functionalities, especially application in electronic devices.

For TIMs, high thermal conductivity in the vertical direction is needed. Therefore, it is essential to assemble graphene into a vertically aligned architecture to facilitate heat dissipation in the normal direction of contact solid interfaces. It is already reported to prepare vertically aligned graphite film by compacting aligned graphite sheets. However, it's difficult to fabricate this type of material in an automatic and cost-effective way. Moreover, due to high stiffness and weak interlayer bonding strength of graphite, the vertically assembled graphite composite shows high hardness and is brittle at the direction perpendicular to the assembled direction.

Therefore, improved methods to vertically align graphene are desired to increase the usability of thermal interface materials with high out-of-plane thermal conductivity.

SUMMARY

In view of above-mentioned and other drawbacks of the prior art, it is an object of the present invention to provide an improved method of manufacturing a thermally conductive film.

According to a first aspect of the invention, there is provided a method of manufacturing a vertically aligned laminated graphene based thermally conductive film. The method comprising: providing a first graphene film; providing a second graphene film; arranging a layer of nanoparticles on a surface of the first graphene film, wherein the nanoparticles are configured to improve an adhesion strength between the first and second graphene films; arranging an adhesive on the first graphene film; attaching a second graphene film to the first graphene film by means of the adhesive and the layer of nanoparticles; forming a layered film comprising a predetermined number of graphene film layers by repeating the steps of arranging a layer of nanoparticles, arranging an adhesive and attaching a graphene film; and laminating the layered film by applying pressure and heat to cure the adhesive, thereby forming a laminate film; cutting the laminate film at an angle in relation to a surface plane of the film to form the vertically aligned laminated graphene based thermally conductive film.

That the resulting thermally conductive film is vertically aligned means that the film comprises graphene film layers being tilted in relation to a surface plane of the film, and where each layer of the graphene film reach through the thermally conductive film, from a bottom surface to the top surface of the thermally conductive film.

The graphene film can be considered to comprise a plurality of graphene layers arranged to form a graphene film. The graphene film may for example be formed from graphene flakes having an average lateral size in the range of 2-100 μm. It is thus not required that the graphene film is a continuous graphene layer. Instead, the graphene film may consist of a stack of graphene layers, and the graphene film may thus be seen as a graphene based film. The lateral size of the graphene flakes in such a graphene film determines the amount of grain boundaries in the material. Since the grain boundaries can greatly increase the phonon scattering and thereby decrease thermal conductivity, it is desirable to increase the lateral size of the graphene flakes to reduce the amount of grain boundaries, thereby improving in-plane thermal conductivity of the graphene film.

The present invention is based on the realization that a thermally conductive film having advantageous and configurable properties can be manufactured according to the described method. By controlling the ratio between adhesive and graphene film, the flexibility and tensile strength of the resulting thermally conductive film can be controlled and significantly increased in comparison to known vertically aligned graphene or graphite based films. In practice, there may be a trade off between the flexibility of the film and the thermal properties depending on the selected ratio of adhesive to graphene. A further advantage is that the relation between the in-plane and the out-of-plane thermal conductivity can be controlled by controlling the tilt angle of the graphene layers. Accordingly, the described film can offer high thermal transport both in the vertical direction as well as in a selected direction in the plane of the film.

Due to the tilted angle of graphene layers in the thermally conductive film, crack formation during film deformation can be prevented. When applying a force in the vertical direction, i.e. on the surface of the film, part of the force will pass through the graphene film to the glue layer and be absorbed by the glue layer. The more force applied on the structure, the more force will be transferred to and absorbed by the glue layer, therefore, reducing the damage of the graphene film structures. After releasing the force, the energy stored in each glue layer will recover the whole assembled structure to the original positions.

According to one embodiment of the invention, the layer of nanoparticles may comprise needle shaped nanoparticles configured to anchor the first graphene film to the second graphene film. It has been found that the use of anchoring nanoparticles can serve to greatly enhance the adhesion between adjacent layers of graphene film. The nanoparticle may also have a spider-like shape where a number of needle structures protrude from a central portion.

According to one embodiment of the invention, the nanoparticles may advantageously be needle shaped nanoparticles formed from one of $Al_2O_3$, $SiO_2$, $Fe_2O_3$, $NiO_2$, $Cr_2O_3$, ZnO, Ag, Al, Cu, Ni, Cr, Ti, Mo, Fe, Mg and Li. It has been found that the aforementioned materials can be used to form suitable nanostructures to be used for anchoring.

According to one embodiment of the invention, the needle shaped nanoparticles may have a length in the range of 5 to 100 nm. A spider-like structure would thus have a diameter in the range of approximately 5 to 200 nm.

According to one embodiment of the invention, the laminate film is cut at an angle in the range of 5° to 85° in relation to the surface plane of the film. Thereby, for low angles, the laminate film predominantly conducts heat in the vertical direction whereas for high angles heat conduction is mainly horizontal. Accordingly, the properties of the vertically aligned laminated graphene based thermally conductive film can be controlled by controlling the cutting angle used when forming the film.

According to one embodiment of the invention, laminating the layered film comprises heating the film to a temperature in the range of 80° C. to 200° C. for a time period in the range of 10 to 300 minutes to cure the adhesive and to form the final film. The time and temperature required may be determined based on the choice of adhesive.

According to one embodiment of the invention, laminating the layered film comprises applying a pressure in the range of 0.1 to 3 MPa. The properties of the final film will depend on the parameters used for lamination.

According to one embodiment of the invention, the adhesive may be printed, dispensed or sprayed onto the graphene film. Printing may for example be performed using screen printing or stenciling. Moreover, all of the described methods can in principle be performed irrespective of the size of the surface on which the adhesive is deposited. Thereby, an easily scalable method is provided where an arbitrary size of the laminate structures can be handled.

According to one embodiment of the invention, the nanoparticles are printed, dispensed or sprayed onto the adhesive.

According to one embodiment of the invention, the laminate film may be cut using wire cutting or sawing. The thickness of the final film may in principle be selected arbitrarily. For example, the thickness may be in the range of 10 μm up to 1 cm.

According to one embodiment of the invention, the graphene film may advantageously comprise a plurality of graphene layers having a turbostratic alignment between adjacent graphene layers. It has been found that a graphene or graphite film with turbostratic alignment between adjacent graphene layers exhibits a greatly improved in-plane thermal conductivity in comparison to known graphene-based and graphite heat spreading materials. The improved thermal conductivity can be explained by a reduced phonon scattering as a result of weaker interlayer binding for the turbostratic structure. In comparison, the strong interlayer binding between ordered graphene layers can lead to severe phonon interfacial scattering and reduce thermal conductivity of graphite films.

According to one embodiment of the invention, a ratio of adhesive in the in the laminated film is in the range of 10 wt % to 90 wt %. Thereby, the flexibility and thermal properties of the film can be controlled by controlling the ratio between adhesive and graphene film layers. Thermally conductive films with a high flexibility may be required in applications where the film is exposed to external pressure and where a more rigid film would run the risk of cracking.

According to one embodiment of the invention, the adhesive may consist of at least one of, polyurethane, silicone rubber, polyimide, epoxy resin and polyacrylic resin. In particular, the adhesive used to bond the graphene films together may be a silicone rubber based polymer which has the property of high elasticity. The use of a silicone rubber based polymer can improve the flexibility and compression ratio of the assembled graphene film structure.

According to a second aspect of the invention there is provided a laminated graphene based thermally conductive film comprising a plurality of layers of graphene film reaching from a bottom surface to a top surface of the film, each layer of graphene film being separated from an adjacent layer of graphene film by an adhesive layer, wherein each layer of graphene film is tilted with respect to a surface plane of the thermally conductive film.

Effects and features of the second aspect of the invention are largely analogous to those described above in connection with the first aspect of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing an example embodiment of the invention, wherein.

DETAILED DESCRIPTION OF EXAMPLE EMBODIMENTS

Figure 1:
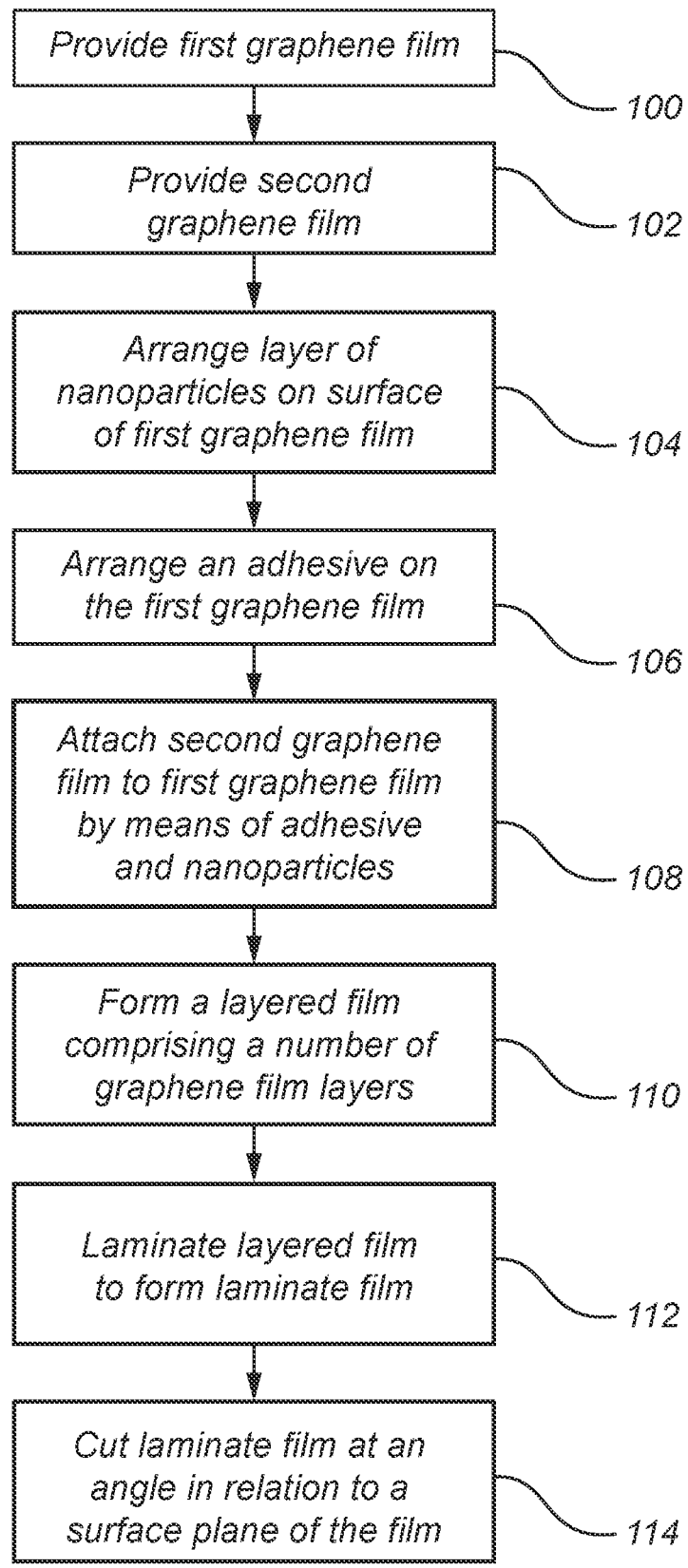
FIG. 1 is a flow chart outlining general steps of a method according to an embodiment of the invention.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person. Like reference characters refer to like elements throughout.

FIG. 1 is a flow chart outlining general steps of a method according to an embodiment of the invention, and the method will be described with further reference to FIG. 2 schematically illustrating steps of the method.

Figure 2A:
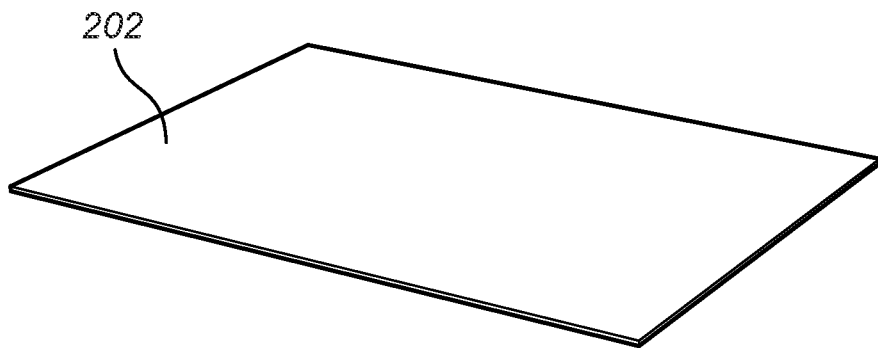
FIGS. 2A-H schematically illustrate steps of a method according to an embodiment of the invention.
Figure 2A:
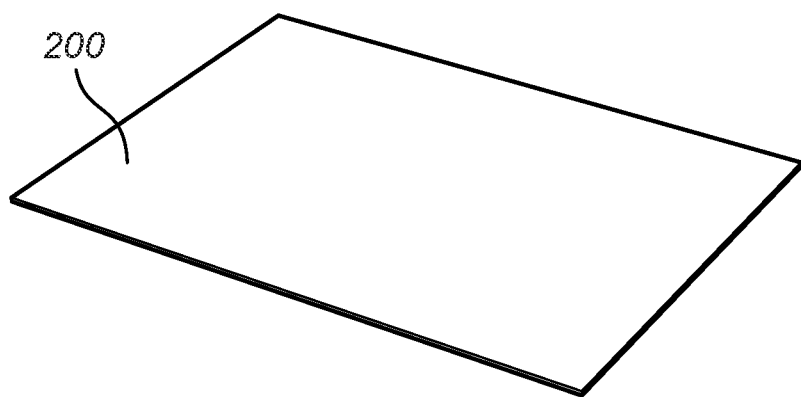

The method comprises providing 100 a first graphene film 200 and providing 102 a second graphene film 202 as illustrated in FIG. 2A. A graphene film suitable for use in the present context can be formed by providing graphene oxide sheets in an aqueous suspension; providing a substrate; providing the suspension on the substrate; heating the suspension on the substrate to form a graphene based film by means of self assembly; detaching the graphene based film from the substrate; performing thermal annealing of the graphene based film at a temperature in the range of 2800-3300° C. in an inert ambient; and pressing the graphene based film at a pressure in the range of 50-300 MPa. By means of the above described method a large-scale achievable method of producing a freestanding graphene film (GF) with an ultra-high in-plane thermal conductivity is provided. Further details of a graphene film having a high in-plane thermal conductivity and a method for manufacturing such a film can be found in PCT/SE2017/050185, hereby incorporated by reference.

The graphene film 200, 202 may also comprise a plurality of graphene layers having a turbostratic alignment between adjacent graphene layers. It has been found that a graphite film with turbostratic alignment between adjacent graphene layers may exhibit an improved in-plane thermal conductivity in comparison to other known graphene-based and graphite heat spreading materials. Further details of a graphene film comprising a plurality of graphene layers having a turbostratic alignment between adjacent graphene layers can be found in PCT/SE2018/000009, hereby incorporated by reference.

Figure 2B:
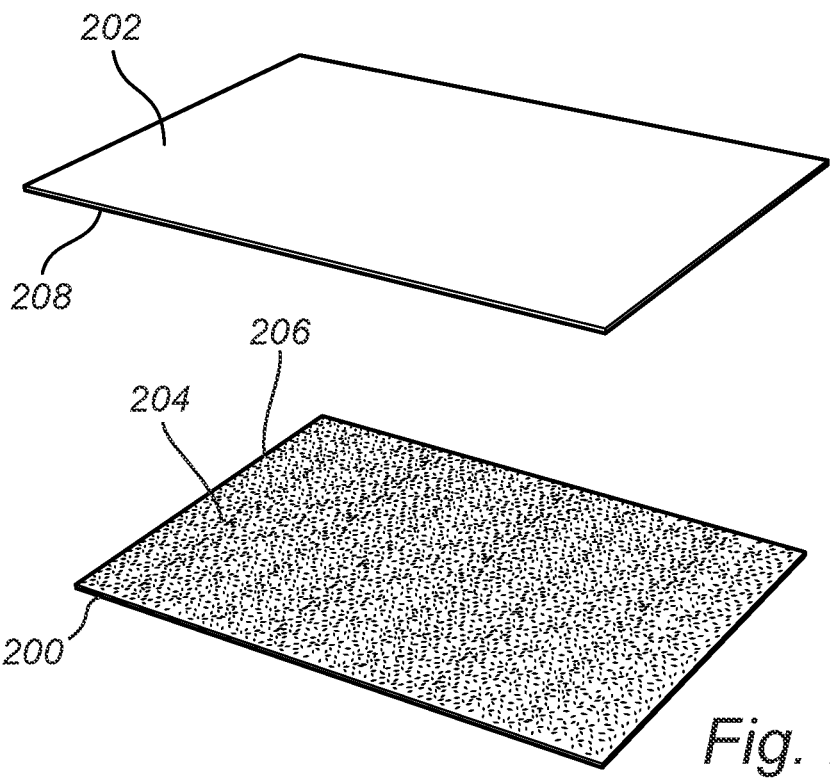
Figure 2C:
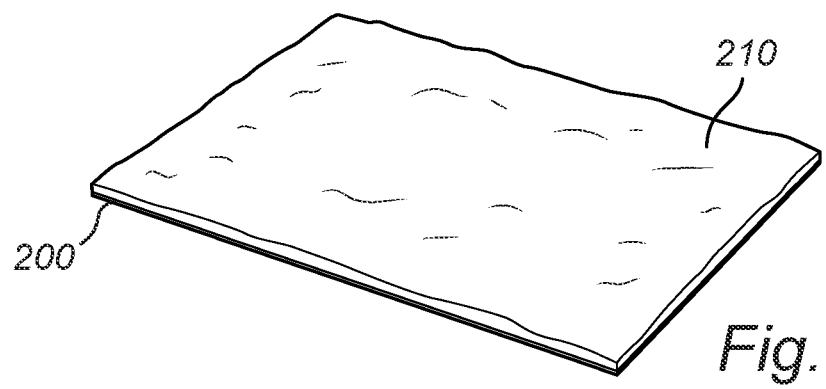

Next, illustrated in FIG. 2B, the method comprises arranging 104 a layer of nanoparticles 204 on a surface 206, 208 of the first and second graphene film 200, 202, wherein the nanoparticles 204 are configured to improve an adhesion strength between the first and second graphene films 200, 202. FIG. 2C illustrates the following step of arranging 106 an adhesive 210 on the first graphene film 200.

The layer of nanoparticles 204 advantageously comprises needle-shaped nanoparticles 204 configured to anchor the first graphene film 200 to the second graphene film 200 by improving the adhesion between the respective graphene film 200, 202 and the adhesive 210. The needle-shaped nanoparticles may consist of one elongated structure having a length in the range of 5 to 100 nm and an aspect ratio between length and width in the range of 5:1 to 50:1.

However, nanoparticles usable for anchoring may also comprise a plurality of more or less randomly connected needle-like nanostructures, e.g. forming a spider-like nanostructure. Moreover, the described type of nanoparticles can be formed from e.g. $Al_2O_3$, $SiO_2$, $Fe_2O_3$, $NiO_2$, $Cr_2O_3$, ZnO, Ag, Al, Cu, Ni, Cr, Ti, Mo, Fe, Mg and Li. Both the nanoparticles and the adhesive may be printed, dispensed or sprayed onto the graphene film.

Figure 2D:
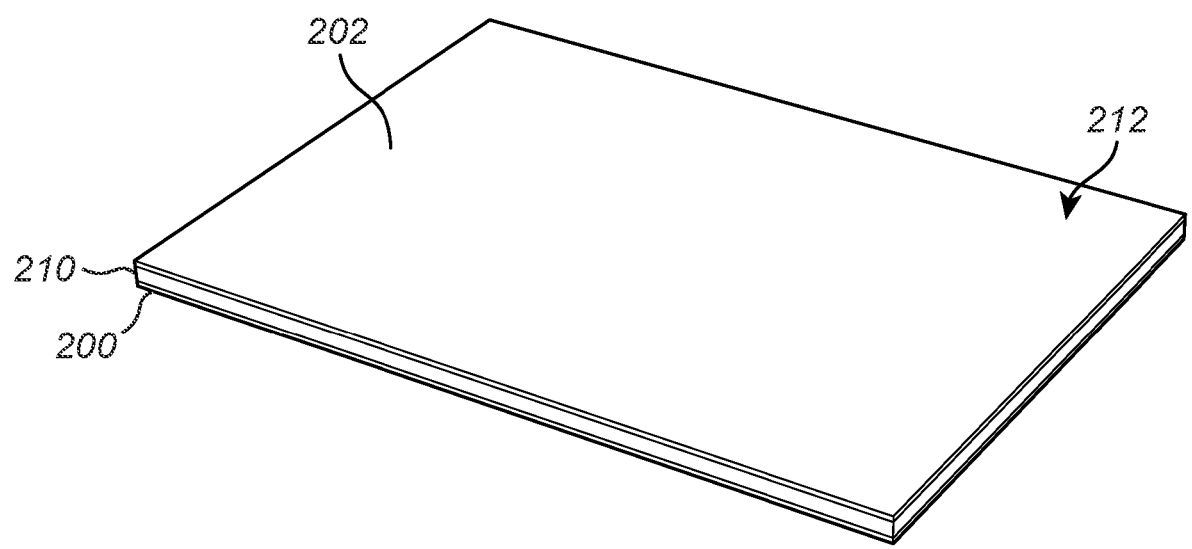

Once the nanoparticles 204 and the adhesive 210 is deposited on the graphene film, the second graphene film 202 is attached 108 to the first graphene film 200 by means of the adhesive 210 and the layer of nanoparticles 204 with the resulting layered film 212 illustrated in FIG. 2D. The nanoparticles 204 will become anchored to irregularities and uneven portions of the graphene film surface, and the adhesive 210 will in turn form a bond to both the graphene film surface and to the nanoparticles. Thereby, the adhesion between the first and second graphene films 200, 202 is significantly improved compared to if only an adhesive would be used.

According to an illustrative example, a graphene film with a thickness of 10 μm was coated by an adhesive in the form of polydimethylsiloxane belonging to the group of silicone rubbers. Tetrahydrofuran was used as a solvent to adjust the viscosity of polydimethylsiloxane. The concentration of the polydimethylsiloxane in tetrahydrofuran is in the range of 25-75 wt %. The deposition process was performed using a film coater. The coating thickness of polydimethylsiloxane is defined by the thread depth of the coating bar. After coating of the adhesive, the graphene film was heated to approximately 50-70° C. for 1-20 min to remove the tetrahydrofuran. The thickness of the adhesive layer may be selected based on the desired proportion between graphene film and adhesive in the final laminate structure.

Figure 2E:
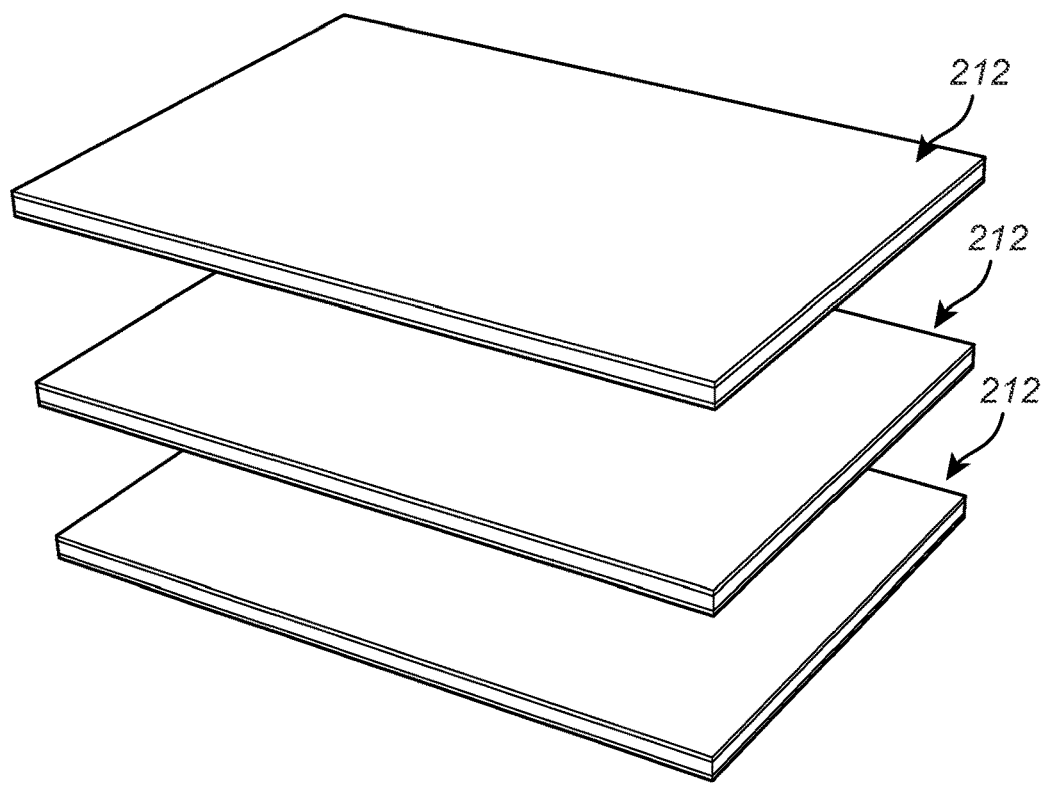

The above description outlines a method for attaching two graphene films 202, 204 to each other. Next, the method comprises forming 110 a layered film 212 comprising a predetermined number of graphene film layers by repeating the steps of arranging 104 a layer of nanoparticles, arranging 106 an adhesive and attaching 108 a graphene film. By combining a number of layered films 212 as illustrated in FIG. 2E, or by attaching one graphene layer at the time to a growing stack of graphene layers attached to each other by the described nanoparticles 204 and adhesive 210, a layered film 214 of desirable thickness can be achieved.

Figure 2F:
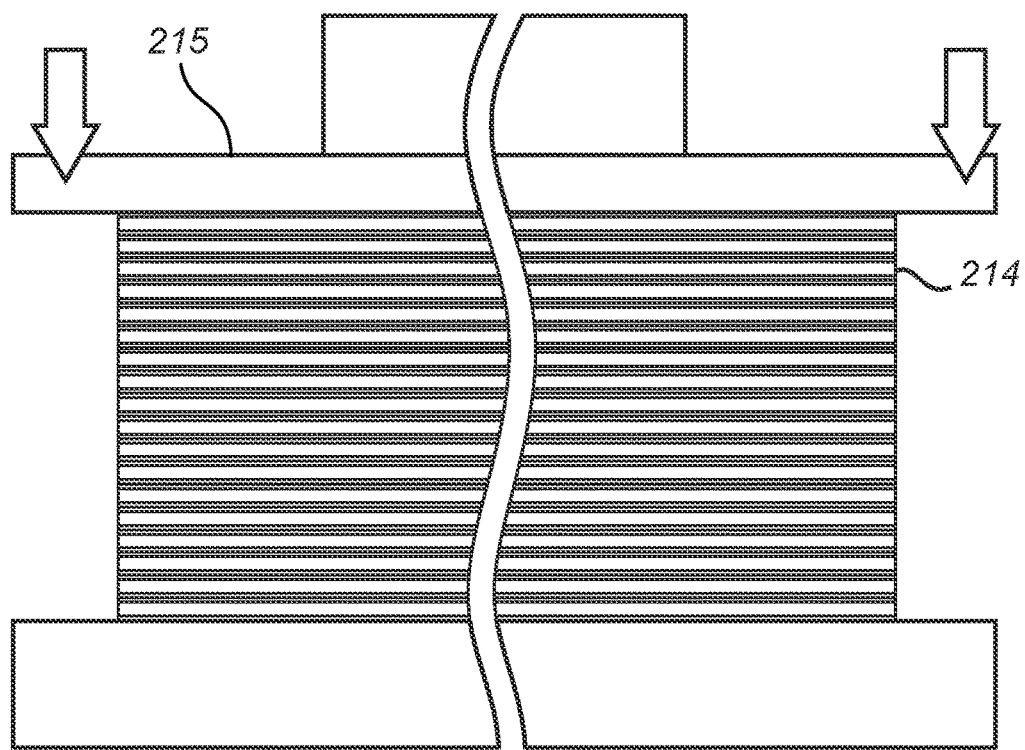
Figure 2G:
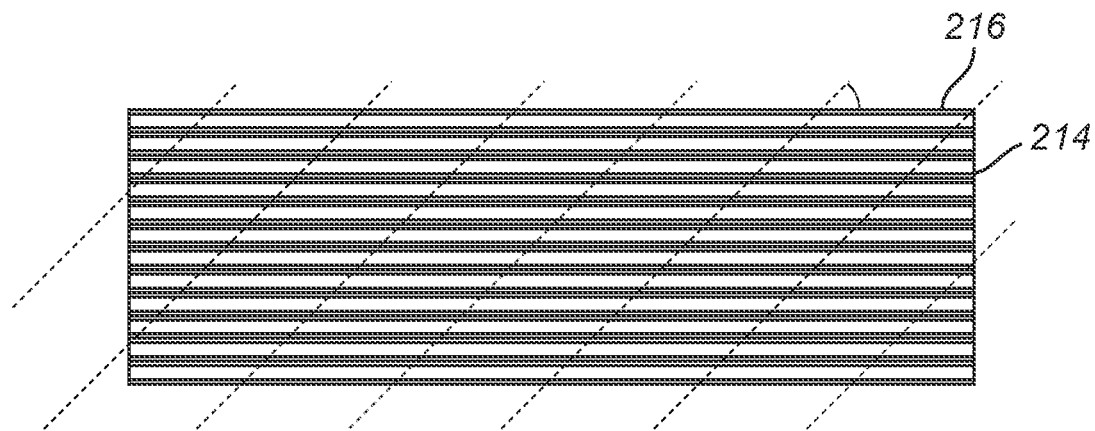
Figure 2H:
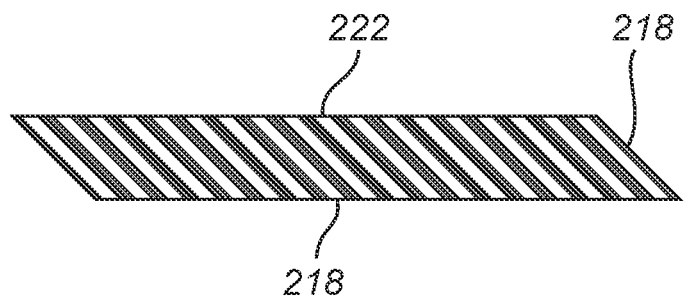

The layered film 214 comprising the desired number of layers is laminated 112 by applying pressure using a pressure tool 215 as illustrated in FIG. 2F and by heating to cure the adhesive 210, thereby forming a laminate film 216. The pressure is in the range of 0.1 to 3 MPa. The assembled laminate film 216 is subsequently put into a furnace for curing. The curing temperature is in the range of 80-200° C. and the curing time is in the range of 10 to 300 minutes.

The final step comprises cutting 114 the laminate film 214 at an angle in relation to a surface plane 216 of the film to form the vertically aligned laminated graphene based thermally conductive film 218. Cutting may for example be performed using wire cutting or a diamond saw, even tough other cutting methods also are possible. That the film is vertically aligned here means that each graphene film layer reaches through the laminated film 218, from a bottom surface 220 to a top surface 222 of the film 218.

It is also possible to cut the laminate film 214 by arranging it in a tilted holder and cutting vertically, which may simplify the manufacturing procedure. After cutting, the surfaces 220, 222 of the laminated film 218 may advantageously be polished to smooth the surfaces. The surface roughness of the final film is 218 preferably less than 1 μm.

Figure 3:
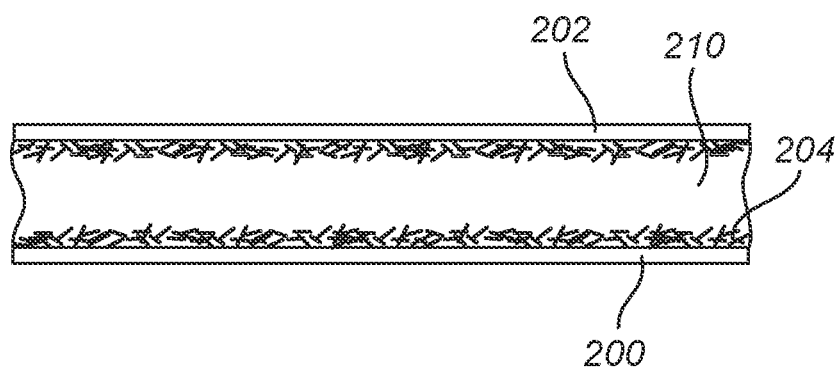
FIG. 3 schematically illustrates a detail of a method according to an embodiment of the invention.

FIG. 3 is a close up illustration of two graphene films 200, 202 attached to each other where it is shown how the nanoparticles 204 are attached to the surfaces of the two graphene films 200, 202 and embedded in the adhesive 210. Accordingly, the nanoparticles 204 will be present in the adhesive 210, which may be significantly thicker than the length of the nanoparticles 204.

Figure 4:
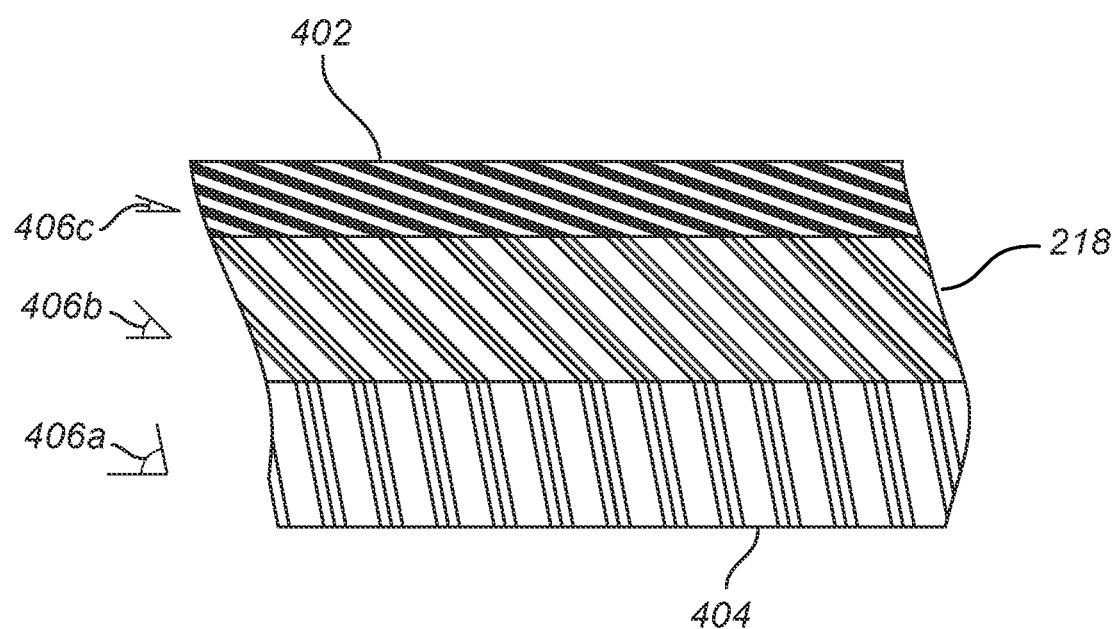
FIG. 4 schematically illustrates a thermally conductive film according to an embodiment of the invention.

FIG. 4 schematically illustrate a thermal interface material 400 comprising a plurality of layers of the thermally conductive film described above, where a tilt angle 406a-c of the graphene film layer of the thermally conductive film with respect to a surface plane 402 of the thermal interface material 400 decreases for each layer of the thermally conductive film as seen from a bottom side 404 of the thermal interface material. Thereby, a thermal interface material 400 where the main direction of heat transfer changes with the distance from the surface onto which the thermal interface material 400 is attached. In particular in the structure illustrated in FIG. 4, the main direction of heat transfer changes from vertical to horizontal with increasing distance from the surface. This allows for more controlled and tailored heat conduction which can be adapted to the requirements of a specific application.

Even though the invention has been described with reference to exemplifying embodiments thereof, many different alterations, modifications and the like will become apparent for those skilled in the art. Also, it should be noted that parts of the method may be omitted, interchanged or arranged in various ways, the method yet being able to perform the functionality of the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. A method of manufacturing a vertically aligned laminated graphene based thermally conductive film, the method comprising:
    providing a first graphene film;
    providing a second graphene film;
    arranging a layer of nanoparticles on a surface of the first and second graphene film, wherein the nanoparticles are configured to improve an adhesion strength between the first and second graphene films;
    arranging an adhesive on the layer of the nanoparticles on the first graphene film;
    attaching the second graphene film to the first graphene film by means of the adhesive and the layer of nanoparticles;
    forming a layered film comprising a predetermined number of graphene film layers by repeating the steps of arranging a layer of nanoparticles, arranging an adhesive and attaching a graphene film; and
    laminating the layered film by applying pressure and heat to cure the adhesive, thereby forming a laminate film;
    cutting the laminate film at an angle in relation to a surface plane of the film to form the vertically aligned laminated graphene based thermally conductive film.

2. The method according to claim 1, wherein the layer of nanoparticles comprises needle shaped nanoparticles configured to anchor the first graphene film to the second graphene film.

3. The method according to claim 2, wherein the needle shaped nanoparticles are formed from one of $Al_2O_3$, $SiO_2$, $Fe_2O_3$, $NiO_2$, $Cr_2O_3$, ZnO, Ag, Al, Cu, Ni, Cr, Ti, Mo, Fe, Mg and Li.

4. The method according to claim 2, wherein the needle shaped nanoparticles have a length in the range of 5 to 100 nm.

5. The method according to claim 1, wherein the laminate film is cut at an angle in the range of 5° to 85°.

6. The method according to claim 1, wherein laminating the layered film comprises heating the film to a temperature in the range of 80° C. to 200° C. for a time period in the range of 10 to 300 minutes.

7. The method according to claim 1, wherein laminating the layered film comprises applying a pressure in the range of 0.1 to 3 MPa.

8. The method according to claim 1, wherein the adhesive is printed, dispensed or sprayed onto the graphene film.

9. The method according to claim 1, wherein the nanoparticles are printed, dispensed or sprayed onto the graphene film.

10. The method according to claim 1, wherein the laminate film is cut using wire cutting or sawing.

11. The method according to claim 1, wherein the graphene film comprises a plurality of graphene layers having a turbostratic alignment between adjacent graphene layers.

12. The method according to claim 1, wherein a ratio of adhesive in the in the laminated film is in the range of 10 wt % to 90 wt %.

13. The method according to claim 1, wherein the adhesive consists of at least one of, polyurethane, silicone rubber, polyimide, epoxy resin and polyacrylic resin.

* * * * *